United States Patent [19]

Hitch et al.

[11] 3,962,143

[45] June 8, 1976

[54] REACTIVELY-BONDED THICK-FILM INK

[75] Inventors: Thomas Tipton Hitch, Trenton; Thomas Ernest McCurdy, Belle Mead, both of N.J.

[73] Assignee: RCA Corporation, New York, N.Y.

[22] Filed: Mar. 27, 1974

[21] Appl. No.: 455,371

[52] U.S. Cl. .............................. 252/514; 252/518
[51] Int. Cl.² ...................... H01B 1/02; H01C 1/02; H01B 1/06; H01C 1/06
[58] Field of Search ............ 252/514, 518; 117/227; 428/432

[56] References Cited
UNITED STATES PATENTS

| | | | |
|---|---|---|---|
| 2,771,380 | 11/1956 | Coleman et al. | 117/227 |
| 3,293,501 | 12/1966 | Martin | 252/514 |
| 3,843,350 | 10/1974 | Larry | 252/514 |
| 3,851,228 | 11/1974 | Sheard | 252/514 |

Primary Examiner—Benjamin R. Padgett
Assistant Examiner—Josephine Lloyd
Attorney, Agent, or Firm—Glenn H. Bruestle; Arthur E. Wilfond; William S. Hill

[57] ABSTRACT

A thick-film ink for forming electrically conductive areas on ceramic substrates comprising an organic vehicle and solids composed of 0.5–8% by weight cupric oxide and 99.5–92% by weight finely divided silver.

4 Claims, 1 Drawing Figure

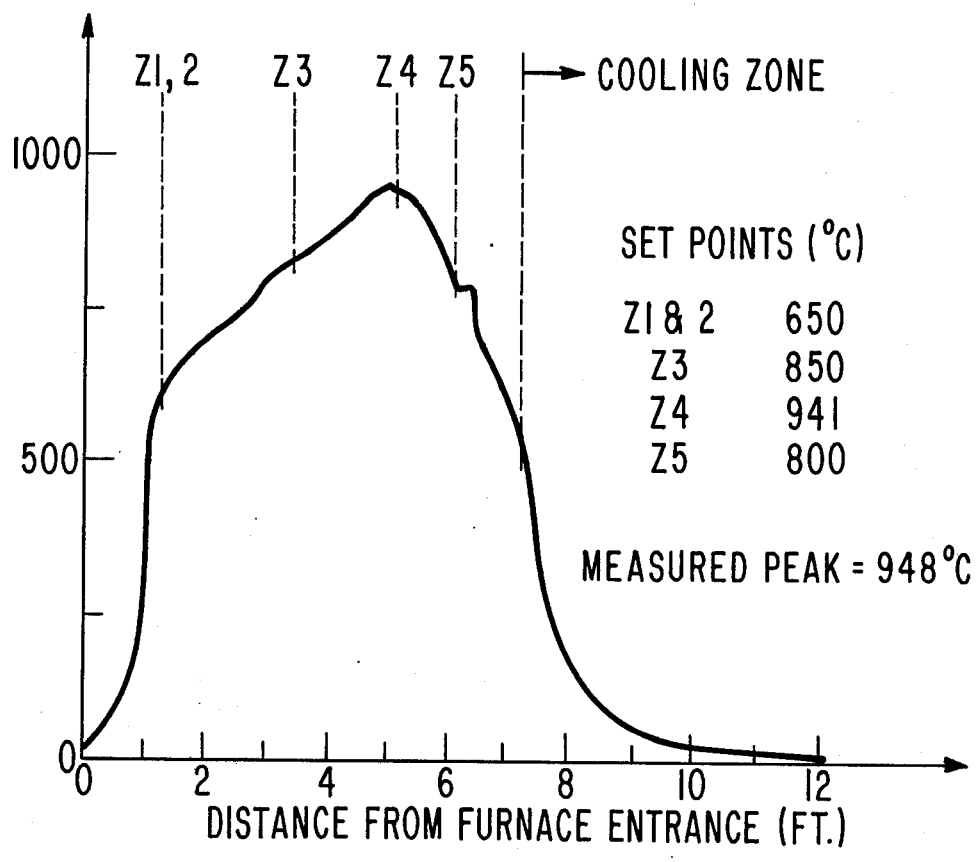

REACTIVELY-BONDED THICK-FILM INK

BACKGROUND OF THE INVENTION

Ink compositions for printing patterns of conductors or resistors on ceramic substrates, in the manufacture of thick-film hybrid circuits, have usually comprised pastes containing certain noble metals and noble metal oxides, glass frits, organic binders and solvents. Usually, the pastes have been screen-printed on the substrate and fired to sinter the metallic ingredients, fuse the glass components and burn off the organic binders. The glass components as well as certain other ingredients such as bismuth oxide and other fluxing agents, are present to secure adhesion to the substrate. This type of composition is known as a frit-bonded type.

Because the frit-bonded type compositions have usually included rather high proportions of very expensive metals such as platinum, palladium and gold, an effort has been made to find suitable ink compositions utilizing less expensive metals. Also, because compositions containing substantial percentages of glass frits i.e. 5–30 weight %, are sometimes difficult to make soldered connections to, an effort has been made to discover compositions which use little or no glass frit but have good adherence properties and high conductivity (where conductors rather than resistors are involved).

The effort to find suitable substitutes for frit-bonded ink compositions has resulted in the discovery of another type of ink known as a reactively-bonded ink. In this type of ink, adherence to the substrate takes place principally through the presence of discrete chemical compounds which are formed during firing, at the film-substrate interface, from components of both the thick-film ink and the substrate.

Reactively-bonded inks contain little or no glass frit. They do contain metals and non-vitreous metal oxides, organic binders and solvents and they may also contain other agents to promote adherence to the substrate. Previously, reactively-bonded inks have used mostly heavy base metals such as molybdenum, manganese and tungsten and also iron, chromium, nickel and thorium. These metals have provided strong, age-resistant bonds but they all oxidize and some, like molybdenum, have volatile oxides so that they cannot be fired in air. These materials also usually are not directly wettable by solders (although nickel is an exception to this).

SUMMARY OF THE INVENTION

It has now been found that improved, relatively inexpensive reactively-bonded inks can be made using certain proportions of powdered cupric oxide and powdered silver (including silver flake), plus conventional organic binders and solvents.

THE DRAWING

The single FIGURE is a graphical representation of the temperature profile of a belt type furnace used to fire deposited films incorporating inks of the present invention.

DESCRIPTION OF PREFERRED EMBODIMENTS

Thick-film, reactively-bonded inks, in accordance with the present invention, may be made up as follows. First, powdered cupric oxide and powdered silver are mixed by ball milling. Considering just these two solids ingredients, proportions may range from about 0.5–8% by weight of cupric oxide and about 99.5–92% by weight of powdered silver. The copper oxide may be technical grade having a fineness of about 400 mesh. The silver may be a commercial grade of silver powder, including silver flake.

The metallic ingredients are mixed with a vehicle so that the resulting composition has the proper consistency for screen printing. One type of vehicle that may be used is a solution of ethyl cellulose in terpineol. Other solvents that may be used are cellosolve, butyl carbitol, dibutyl carbitol, glyceryl triacetate and butyl carbitol acetate. Other resinous ingredients such as hydroxypropylcellulose can also be used.

The final ink compositions may contain about 10–20% by weight of vehicle and 80–90% of solids. As an example, the vehicle may be 25% ethylcellulose and 75% terpineol. Various thixotropic control agents and wetting agents can also be included in the compositions to enhance printing characteristics but their use is optional.

The substrates preferably used with these inks comprise alumina ceramics containing about 80–100% $Al_2O_3$. Other ingredients in these ceramics include $SiO_2$, MgO and CaO.

The ink composition is screened onto the substrate in any desired pattern using a stainless steel screen of, for example, 200–325 mesh.

After deposition on the substrate, the film is permitted to settle for about 15 minutes at room temperature to permit the screen pattern to disappear.

The deposited film, which now has a smooth surface, is then dried to remove the solvent portion of the vehicle. This may be done in circulating air oven for 15 minutes at 125°C.

After the drying operation, the substrate and the film are passed through a firing oven having an oxygen-containing atmosphere. The oven may be of a type BTU VQ2 12 ft. belt kiln. Peak firing temperatures are set somewhat below the melting point of silver (which has a melting point of 960°C). The peak firing temperature is also below the melting point of the mix. For example, the furnace may have a temperature profile as shown in the FIGURE.

It has been found that the peak firing temperature of the furnace affects the resistivity of the fired film. In general, the resistivityy decreases as the peak firing temperaure increases.

After firing at 3°C below the melting point of the ink having 2 wt. % of CuO, at a belt speed of 3 inches/minute, resistivities of the ½ wt. % CuO, 2 wt. % CuO and 8 wt. % CuO inks were 3.0, 3.2 and 3.4 $\mu$ ohm cm, respectively. The bulk resistivity of silver is 1.59 $\mu$ ohm cm. These values are for inks in which the silver is in the flake form. The corresponding resistivities for inks containing the same percentages of non-flake silver powder are somewhat higher.

All of the fired inks described herein exhibited good adherence to the ceramic substrate and the adhesion strength increased sharply as peak firing temperature approached the melting point of the ink mix.

During the firing operation, the organic resin binder is burned off and the ink constituents react with the substrate.

We claim:

1. A reactively-bonded thick-film conductive ink composition comprising about 10–20% by weight of a vehicle, and 90–80% by weight of solids consisting essentially of about 0.5–8% by weight of cupric oxide, and 99.5–92% by weight of finely divided silver and no glass frit.

2. An ink composition according to claim 1 in which said vehicle includes ethyl cellulose as a binder.

3. An ink according to claim 2 including terpineol as a solvent for said ethyl cellulose.

4. An ink according to claim 1 in which said silver is in flake form.

* * * * *